United States Patent
Naseef

(10) Patent No.: US 12,363,566 B2
(45) Date of Patent: Jul. 15, 2025

(54) TESTER AND METHOD FOR WLAN HANDOVER (ROAMING) PERFORMANCE

(71) Applicant: Rohde & Schwarz GmbH & Co. KG, Munich (DE)

(72) Inventor: Mahmud Naseef, Planegg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 353 days.

(21) Appl. No.: 17/886,706

(22) Filed: Aug. 12, 2022

(65) Prior Publication Data
US 2024/0056841 A1 Feb. 15, 2024

(51) Int. Cl.
*H04W 24/06* (2009.01)
*G01R 29/10* (2006.01)
*H04W 36/08* (2009.01)
*H04W 84/12* (2009.01)

(52) U.S. Cl.
CPC .......... *H04W 24/06* (2013.01); *G01R 29/105* (2013.01); *H04W 36/08* (2013.01); *H04W 84/12* (2013.01)

(58) Field of Classification Search
CPC ..... H04W 24/06; H04W 36/08; H04W 84/12; G01R 29/105
See application file for complete search history.

(56) References Cited

U.S. PATENT DOCUMENTS

| | | | |
|---|---|---|---|
| 7,702,330 B2 | 4/2010 | Alexander et al. | |
| 2003/0157965 A1* | 8/2003 | Marro | H04B 7/086 455/560 |
| 2018/0027435 A1* | 1/2018 | Harrod | H04W 24/06 370/252 |
| 2023/0328669 A1* | 10/2023 | Naik | H04W 52/0216 370/350 |
| 2024/0007070 A1* | 1/2024 | Chance | H03M 1/185 |

* cited by examiner

*Primary Examiner* — Justin Y Lee
(74) *Attorney, Agent, or Firm* — DITTHAVONG, STEINER, & MLOTKOWSKI

(57) ABSTRACT

A method for WLAN handover testing including the steps of connecting a DUT to a first WLAN access point AP1 of a wireless communication tester; measuring, by the wireless communication tester, a performance indicator of the WLAN communication between the DUT and the first access point AP1 of the wireless communication tester; gradually decrease the output power of the first access point AP1 and increase the output power of a second WLAN access point AP1 of the wireless communication tester, in order to cause the DUT to handover its connection to second access point AP2, and measuring, by the wireless communication tester, a performance indicator of the WLAN communication between the DUT and the second success point AP2 of the wireless communication tester.

12 Claims, 2 Drawing Sheets

S1 — Connecting a DUT to AP1

S2 — Measuring connection of DUT to AP1

S3 — Forcing handover from AP1 to AP2

S4 — Measuring connection of DUT to AP2

TESTER AND METHOD FOR WLAN HANDOVER (ROAMING) PERFORMANCE

FIELD OF THE INVENTION

WLAN Access Points (APs) often operate in an environment where the APs are fixed in location, but the client devices move from the coverage area of one AP to another, thus requiring a handover. The handover requires a significant amount of processing power, and often involves a substantial delay and possible loss of data. It is therefore of interest to measure the handover performance of WLAN devices.

BACKGROUND OF THE INVENTION

U.S. Pat. No. 7,702,330B2 discloses the measurement of mobility performance of wireless data communications, particularly for testing the impact of roaming of Wireless Local Area Network (WLAN) devices, such as clients, between their counterparts, such as access points. This prior art approach includes the controlled emulation of roaming by WLAN devices, using a set of WLAN tester units, by activating and deactivating instances of emulated devices on different tester units to simulate the physical translation of the actual WLAN devices in an environment.

SUMMARY OF THE INVENTION

The present invention aims at an improved measurement of the handover (roaming) performance of a (during the test stationary) WLAN DUT vis-à-vis stationary access points.

This object is achieved by means of the features of the independent claims. The dependent claims develop further the central idea of the invention.

According to an aspect, a method for WLAN handover testing comprises the steps of:
Connecting a DUT to a first WLAN access point AP1 of a wireless communication tester,
Measuring, by the wireless communication tester, a performance indicator of the WLAN communication between said DUT and said first access point AP1 of the wireless communication tester,
Gradually decrease the output power of the first access point AP1 and increase the output power of a second WLAN access point AP1 of the wireless communication tester, in order to cause said DUT to handover its connection to second access point AP2, and
Measuring, by the wireless communication tester, a performance indicator of the WLAN communication between said DUT and said second success point AP2 of the wireless communication tester.

The DUT may be a portable health care device, such as e-g a patient monitoring device.

At least one of the measuring steps may be performed while at least one further WLAN communication device is connected to the first and second access point AP1, AP2.

A measurement of at least one performance indicator may be performed as to the connection of the at least one further WLAN communication device.

The first and second access point AP1, AP2, may be arranged within the same anechoic chamber.

The performance indicator can be at least one of:
Handover delay,
Battery/power consumption, and
Connection stability.

A further aspect relates to wireless communication tester, comprising:
A first and at least a second WLAN access point AP1, AP2, designed for connecting to a DUT,
A performance indicator measuring unit to measure a performance indicator of the WLAN communication between said DUT and said first and second access point AP1, AP2 of the wireless communication tester, and
Output power control means for gradually decreasing the output power of the first access point AP1 and increasing the output power of a second WLAN access point AP1 of the wireless communication tester, in order to cause the DUT to handover its connection from said first access point AP1 to said second access point AP2.

The tester may comprise a variable gain signal generator.
The tester may comprise a step attenuator.
The first and second access point AP1, AP2, may be arranged within one anechoic chamber.
The first and the second access point AP1, AP2, may be integrated in the same housing.
The performance indicator may be at least one of:
Handover delay,
Battery/power consumption, and
Connection stability.
The first and the second access point AP1, AP" may share the same clock.

BRIEF DESCRIPTION OF THE DRAWINGS

Further aspects of the invention will now be explained by reference to the figures of the enclosed drawings, showing.

DETAILED DESCRIPTION OF PREFERRED EMBODIMENTS

Figure 1:
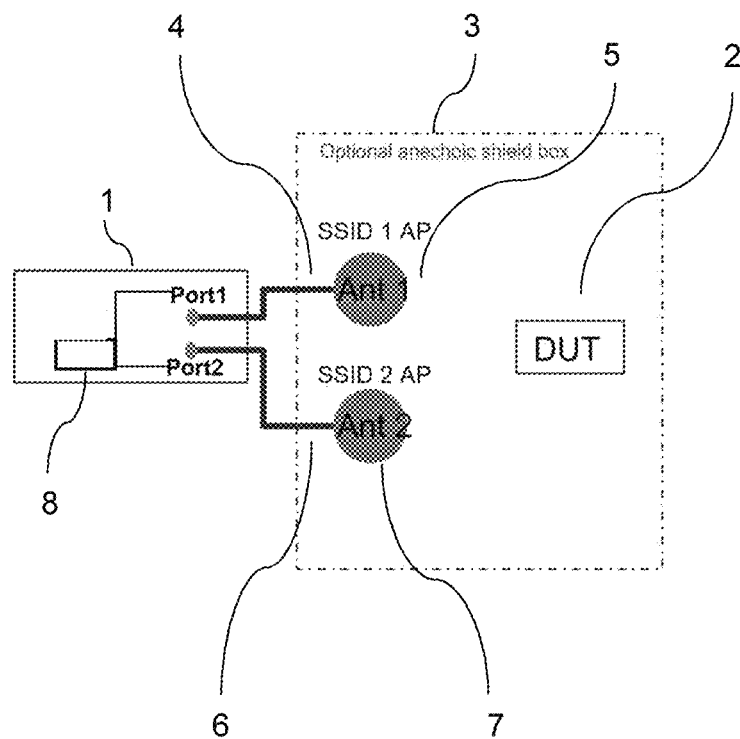
FIG. 1 an illustration of a testing device for WLAN handover performance of a DUT, and
FIG. 2 a flow chart of a method for such testing.

In FIG. 1 a wireless communication testing device 1 is shown having at least a first access point 4 with a wireless antenna 5 as well as a second access point 6 with a second antenna 7. As schematically shown in FIG. 1, at least the access points (antennas) 4, 6 of the tester 1 may be arranged within the same anechoic chamber (anechoic shield box).

Further, a device under test (DUT) 2 is also arranged within wireless communication reach of the access points 4, 6 of the tester 1.

As schematically shown in FIG. 1, both access points 4, 6 of the tester 1 are served by the same (common) clock 8. The access points 4, 56 thus are operating with the same phase and frequency.

One application scenario for the tester 1 is the medical (e.g. hospital) environment. The handover (roaming) performance of the DUT 2 is tested, where it is for example initially connected to the first access point 4, and due to its mobile nature, will fade out the connection of the first access point 4 and will reach a further (stationary) access point 6. In the medical environment, the mobile DUT 2 may be for example a patient monitoring device, which is traveling from the connection range of a first access point to a second access point of a wireless infrastructure.

Furthermore, the mobile DUT 2 may build up WLAN communication with an access point, which is already in communication with a further (mobile or especially stationary) wireless communication device. In the medical environment, this further stationary wireless communication device may be for example an electrocardiography unit.

Figure 2:
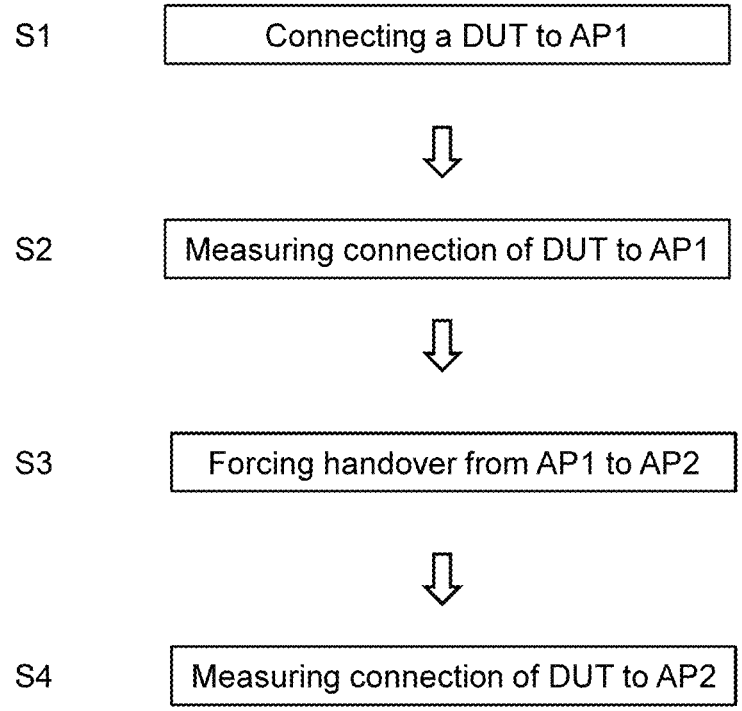

With reference to FIG. 2 now a method will be described in order to simulate a mobile wireless communication DUT 2.

In a first step S1 the DUT 2 is connected to a first WLAN access point AP14 of the wireless communication tester 1.

In a further step S2, the wireless communication tester 1 measures at least one performance indicator as to the WLAN communication between said DUT 2 and said first access point AP14 of the wireless communication tester 1.

In a further step S3, the output power of the first access point AP1 is gradually decreased and the output power of the second WLAN access point AP2 of the wireless communication tester 1 is increased. This causes said DUT 2 to handover (roam) its connection to the second access point AP2.

Note that while this method simulates the handover of a mobile and traveling DUT 2 from a first access point AP1 to a second access point AP2, in the testing environment the DUT 2 is typically arranged stationary relative to the access points 4, 6 of the tester 1, and within the anechoic chamber 3.

The decreasing and increasing of the output power is made with a characteristic simulating the traveling of a mobile wireless communication device 2 relative to the access points. The decrease/increase may be linear with the same slope. However, this decrease/increase of the output power may also be non-linear, with for example by increasing the slope in the area of the higher end of the output power range.

In any case, in a further step S4 the wireless communication tester 1 measures at least one performance indicator of the WLAN communication between said DUT 2 and said second access point AP2 of the wireless communication tester 1.

The wireless communication tester may comprise a variable gain signal generator for implementing the output power adjustment.

The wireless communication tester may comprise a step attenuator for implementing the output power adjustment.

During the measuring steps S2 and S4, a further wireless communication device may be connected to the respective access point. This simulates the above described scenario that a mobile wireless communication device starts connecting, in a handover or roaming process to an access point which is already in communication with a further mobile or preferably stationary WLAN communication device.

Typical performance parameters measured may be the actual handover delay, battery/power consumption, connection stability etc.

The invention claimed is:

1. A method for Wireless Local Area Network (WLAN) handover testing,
comprising the steps of:
connecting a Device Under Test (DUT) to a first WLAN access point AP1 of a wireless communication tester,
measuring, by the wireless communication tester, a performance indicator of the WLAN communication between said DUT and said first access point AP1 of the wireless communication tester,
gradually decrease the output power of the first access point AP1 and increase the output power of a second WLAN access point AP1 of the wireless communication tester, in order to cause said DUT to handover its connection to second access point AP2, and
measuring, by the wireless communication tester, a performance indicator of the WLAN communication between said DUT and said second access point AP2 of the wireless communication tester,
wherein at least one of the measuring steps is performed while at least on a further WLAN communication device is connected to the first and second access point AP1, AP2.

2. The method of claim 1, wherein the DUT is a portable health care device.

3. The method of claim 1, wherein a measurement of at least one performance indicator is performed as to the connection of the at least one further WLAN communication device.

4. The method of claim 1, wherein the first and second access point AP1, AP2, are arranged within one anechoic chamber.

5. The method of claim 1, wherein the performance indicator is at least one of:
handover delay,
battery/power consumption, and
connection stability.

6. A wireless communication tester, comprising:
a first and at least a second WLAN access point AP1, AP2, designed for connecting to a DUT,
a performance indicator measuring unit to measure a performance indicator of the WLAN communication between said DUT and said first and second access point AP1, AP2 of the wireless communication tester, and
output power control means for gradually decreasing the output power of the first access point AP1 and increasing the output power of a second WLAN access point AP1 of the wireless communication tester, in-order to cause the DUT to handover its connection from said first access point AP1 to said second access point AP2, wherein the first and second access point AP1, AP2, are arranged within one anechoic chamber.

7. The tester of claim 6, comprising a variable gain signal generator.

8. The tester of claim 6, comprising a step attenuator.

9. The tester of claim 6, wherein the first and the second access point AP1, AP2, are integrated in the same housing.

10. The tester of claim 6, wherein the performance indicator is at least one of:
handover delay,
battery/power consumption, and
connection stability.

11. The tester of claim 6, wherein the first and the second access point AP1, AP2, share the same clock.

12. A method for Wireless Local Area Network (WLAN) handover testing, comprising the steps of:
connecting a Device Under Test (DUT) to a first WLAN access point AP1 of a wireless communication tester,
measuring, by the wireless communication tester, a performance indicator of the WLAN communication between said DUT and said first access point AP1 of the wireless communication tester,
gradually decrease the output power of the first access point AP1 and increase the output power of a second WLAN access point AP1 of the wireless communication tester, in order to cause said DUT to handover its connection to second access point AP2, and
measuring, by the wireless communication tester, a performance indicator of the WLAN communication between said DUT and said second access point AP2 of the wireless communication tester, wherein the first and second access point AP1, AP2, are arranged within one anechoic chamber.

\* \* \* \* \*